US010139443B2

(12) United States Patent
Fouedjio et al.

(10) Patent No.: US 10,139,443 B2
(45) Date of Patent: Nov. 27, 2018

(54) CIRCUIT APPARATUS AND METHOD FOR DETECTING A STATE OF AN INTERLOCK LOOP

(71) Applicant: Conti Temic microelectronic GmbH, Nuremberg (DE)

(72) Inventors: Pulcherie Ide Fouedjio, Nuremberg (DE); Karl-Heinz Winkler, Altdorf (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 0 days.

(21) Appl. No.: 15/513,647

(22) PCT Filed: Sep. 14, 2015

(86) PCT No.: PCT/EP2015/070922
§ 371 (c)(1),
(2) Date: Mar. 23, 2017

(87) PCT Pub. No.: WO2016/045998
PCT Pub. Date: Mar. 31, 2016

(65) Prior Publication Data
US 2017/0307674 A1    Oct. 26, 2017

(30) Foreign Application Priority Data
Sep. 24, 2014  (DE) .................. 10 2014 219 235

(51) Int. Cl.
*G01R 31/02*  (2006.01)
*B60L 3/00*  (2006.01)
(Continued)

(52) U.S. Cl.
CPC .......... *G01R 31/025* (2013.01); *B60L 3/0023* (2013.01); *B60L 3/0069* (2013.01);
(Continued)

(58) Field of Classification Search
CPC ............................ G01R 31/025; B60L 3/0069
(Continued)

(56) References Cited

U.S. PATENT DOCUMENTS

| 7,084,361 B1 * | 8/2006 | Bowes .................. B60L 3/0069 |
| | | 200/16 R |
| 8,199,449 B2 | 6/2012 | Kuschnarew et al. .......... 361/88 |

(Continued)

FOREIGN PATENT DOCUMENTS

| DE | 102012105631 A1 | 1/2014 | ............... B60L 3/00 |
| WO | 2009/112165 A2 | 9/2009 | ............ B60L 11/123 |
| WO | 2016/045998 A1 | 3/2016 | ............. B60L 11/18 |

OTHER PUBLICATIONS

German Office Action, Application No. 102014219235.8, 9 pages, dated Aug. 6, 2015.
(Continued)

*Primary Examiner* — Reena Aurora
(74) *Attorney, Agent, or Firm* — Slayden Grubert Beard PLLC

(57) ABSTRACT

The present disclosure relates to high-voltage circuits. The teachings thereof may be embodied in a circuit apparatus for detecting a state of an interlock loop monitoring a high-voltage component. The apparatus may include a power connection to a voltage source; a ground connection; a positive connection to a line end of the electrical interlock loop; a negative connection to a second line end of the interlock loop; a measuring arrangement for a voltage potential at the negative connection when two mutually different currents flow from the power connection via the negative connection to the ground connection; and a detector arrangement comparing the two potential measurements at the two respective currents with two predefined potential reference values and ascertaining, based on the comparison results of the comparison unit, whether the negative connection is (Continued)

electrically short-circuited with the positive connection, the power connection, or the ground connection, or with none of these connections.

10 Claims, 2 Drawing Sheets

(51) Int. Cl.
*B60L 3/04* (2006.01)
*B60L 11/00* (2006.01)
*B60L 11/18* (2006.01)
*G07C 5/08* (2006.01)
*H02H 3/20* (2006.01)

(52) U.S. Cl.
CPC .............. *B60L 3/04* (2013.01); *B60L 11/005* (2013.01); *B60L 11/1805* (2013.01); *B60L 11/1818* (2013.01); *G07C 5/08* (2013.01); *H02H 3/20* (2013.01); *B60L 2270/32* (2013.01); *B60L 2270/34* (2013.01); *Y02T 10/7005* (2013.01); *Y02T 10/7022* (2013.01); *Y02T 10/7072* (2013.01); *Y02T 90/14* (2013.01)

(58) Field of Classification Search
USPC .......................................................... 324/509
See application file for complete search history.

(56) References Cited

U.S. PATENT DOCUMENTS

| 9,302,634 | B2 | 4/2016 | Lenz et al. | |
|---|---|---|---|---|
| 2007/0291425 | A1 | 12/2007 | Yugou | 361/23 |
| 2013/0187634 | A1 | 7/2013 | Albrecht | 324/119 |

OTHER PUBLICATIONS

International Search Report and Written Opinion, Application No. PCT/EP2015/070922, 19 pages, dated Dec. 14, 2015.

* cited by examiner

CIRCUIT APPARATUS AND METHOD FOR DETECTING A STATE OF AN INTERLOCK LOOP

CROSS-REFERENCE TO RELATED APPLICATIONS

This application is a U.S. National Stage Application of International Application No. PCT/EP2015/070922 filed Sep. 14, 2015, which designates the United States of America, and claims priority to DE Application No. 10 2014 219 235.8 filed Sep. 24, 2014, the contents of which are hereby incorporated by reference in their entirety.

TECHNICAL FIELD

The present disclosure relates to high-voltage circuits. The teachings thereof may be embodied in a circuit apparatus for detecting a state of an interlock loop, wherein the interlock loop monitors a high-voltage component.

BACKGROUND

Modern vehicles, in particular hybrid electric or electric vehicles, comprise high-voltage on-board power system branches or high-voltage components, e.g., traction batteries, electric machines, power electronics and/or supercapacitors, whose operating voltages are much higher than 60 volts and may be higher than 450 volts. Voltages over 60 volts are extremely dangerous to humans and animals. The high-voltage components are therefore fitted with various contact protection elements, which activate upon signals of possible danger to humans and/or animals. For example, the contact protection elements may include locking elements on the plug contacts or plug connections of the high-voltage components or the housings thereof. The contact protection elements are activated if the plug contacts or plug connections of the high-voltage components are separated or the housings of the high-voltage components are opened.

Furthermore, modern vehicles may include contact protection circuits comprising electrical interlock loops (interlock loop circuits). The contact protection circuits monitor the contact protection elements using the interlock loops. If the contact protection elements are activated in the aforementioned manner, the interlock loops are electrically interrupted. If the corresponding contact protection circuits identify interruptions of this kind in the interlock loops, they send corresponding control signals to the affected high-voltage components and deactivate them. The high-voltage components may be deactivated by electrically isolating the high-voltage components from the high-voltage on-board power system branch or from the on-board power system, and/or by switching off or by discharging the high-voltage components.

SUMMARY

If faults arise in contact protection circuits, e.g., in the interlock loops, the high-voltage components may be deactivated in non-dangerous situations or, conversely, may not be reliably deactivated in dangerous situations and therefore become a source of danger for humans and animals. Therefore, the teachings of the present disclosure may enable reliable protection for humans and animals from the dangers of high-voltage components, in particular in a vehicle. The teachings thereof may include a circuit apparatus for detecting a state of an interlock loop, a contact protection circuit having said circuit apparatus and said interlock loop, and/or a vehicle having said contact protection circuit.

For example, a circuit apparatus (SV) for detecting a state of an electrical interlock loop (VS) for monitoring at least one high-voltage component (HK) may include: a power connection (SA1) for electrical connection to a voltage source; a ground connection (ML) for electrical connection to an electrical ground (MS); a positive connection (PA) for electrical connection to a line end (LE1) of the interlock loop (VS); a negative connection (NA) for electrical connection to a further line end (LE2) of the interlock loop (VS); a measuring arrangement (MA) for measuring the voltage potential (Φ) at the negative connection (NA) when two mutually different currents (I1, I2) flow from the power connection (SA1) via the negative connection (NA) to the ground connection (ML); a detector arrangement (EA), which comprises a comparison unit (KP) for comparing the two potential measurement values (Φ1, Φ2) of the voltage potential (Φ) that are measured at the two currents (I1, I2) with in each case two predefined potential reference values (Ur1, Ur2 and Ur3, Ur4, respectively) and which is configured to ascertain, based on the comparison results of the comparison unit (KP), whether the negative connection (NA) is electrically short-circuited with the positive connection (PA), the power connection (SA1) or the ground connection (ML), or with none of these connections (PA, SA1, ML).

Some embodiments may include a controllable current source (SQ) for providing the two currents (I1, I2), said current source being electrically connected between the negative connection (NA) and the ground connection (ML).

In some embodiments, the current source (SQ) includes a constant current source or as a scalable or modulatable current source.

In some embodiments, the current source (SQ) comprises a current mirror circuit (SP).

As another example, a contact protection circuit (BS) for monitoring at least one high-voltage component (HK) may include: an electrical interlock loop (VS) for monitoring the at least one high-voltage component (HK); and a circuit apparatus (SV) as described above for detecting the state of the interlock loop (VS), wherein the circuit apparatus (SV) is electrically connected to a line end (LE1) of the interlock loop (VS) via the positive connection (PA) and to a further line end (LE2) of the interlock loop (VS) via the negative connection (NA).

As another example, a vehicle, in particular a hybrid electric or electric vehicle, may include: at least one high-voltage component (HK), and at least one contact protection circuit (BS) as described above for monitoring the at least one high-voltage component (HK).

As another example, a method for detecting a state of an electrical interlock loop (VS) for monitoring at least one high-voltage component (HK) with a circuit apparatus (SV) as claimed in one of claims 1 to 4, may include: generating (S100) a first current (I1), which flows from the power connection (SA1) via the negative connection (NA) to the ground connection (ML); measuring (S200) the voltage potential (Φ) at the negative connection (NA), while the first current (I1) is flowing; comparing (S300) a first measured potential measurement value (Φ1) with a first (Ur1) and a second (Ur2) potential reference value, wherein Ur1<Ur2 holds true; generating (S400) a second current (I2), which flows from the power connection (SA1) via the negative connection (NA) to the ground connection (ML); measuring (S500) the voltage potential (Φ) at the negative connection (NA), while the second current (I2) is flowing; comparing (S600) the measured second potential measurement value ($\Phi 2$) with a third (Ur3) and a fourth (Ur4) potential reference value, wherein Ur3<Ur4 holds true; wherein a fault-free state of the interlock loop (VS) is ascertained if the first potential measurement value ($\Phi 1$) lies between the first (Ur1) and the second (Ur2) potential reference value and the second potential measurement value ($\Phi 2$) is greater than the fourth potential reference value (Ur4).

In some embodiments, an electrical interruption of the interlock loop (VS) is ascertained if the first potential measurement value ($\Phi 1$) is smaller than the first potential reference value (Ur1) and the second potential measurement value ($\Phi 2$) is greater than the fourth potential reference value (Ur4).

In some embodiments, an electrical short circuit of the interlock loop (VS) to the power connection (SA1) is ascertained if the first potential measurement value ($\Phi 1$) is greater than the second potential reference value (Ur2) and the second potential measurement value ($\Phi 2$) is greater than the fourth potential reference value (Ur4).10. The method as claimed in one of claims 7 to 9, wherein an electrical short circuit of the interlock loop (VS) to the ground connection (ML) is ascertained if the first potential measurement value ($\Phi 1$) is smaller than the first potential reference value (Ur1) and the second potential measurement value ($\Phi 2$) is smaller than the third potential reference value (Ur3).

BRIEF DESCRIPTION OF THE DRAWINGS

Exemplary embodiments of the present disclosure are explained in more detail below with reference to the attached drawings, in which.

DETAILED DESCRIPTION

Figure 1:
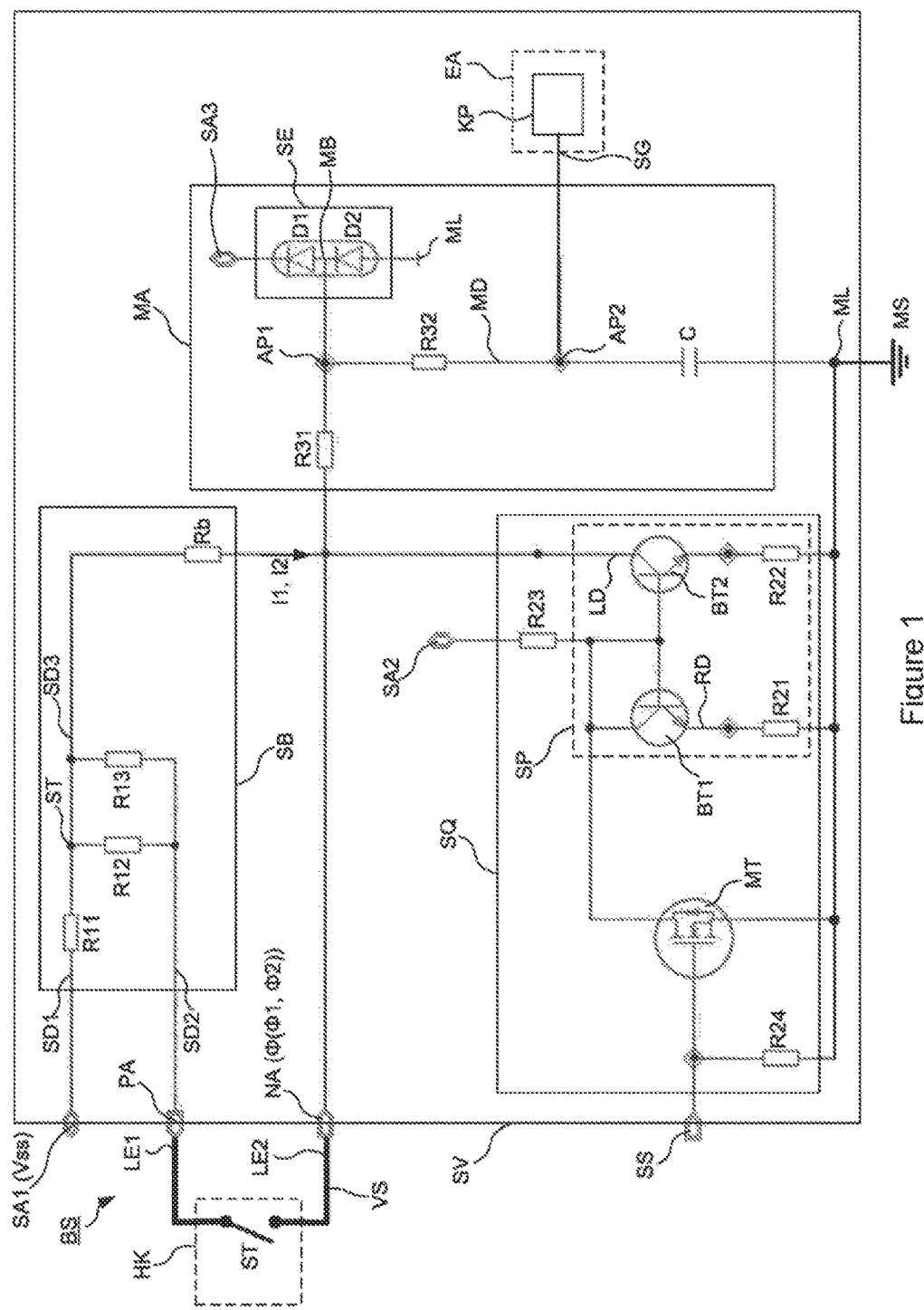
FIG. 1 shows a schematic circuit topology of a contact protection circuit having a circuit apparatus according to the teachings of the present disclosure.

Some embodiments include a circuit apparatus for detecting a state of an electrical interlock loop, in particular of a contact protection circuit of a vehicle, specifically of a hybrid electric/electric vehicle, wherein the interlock loop for its part is configured to monitor at least one high-voltage component, in particular of the vehicle, specifically the hybrid electric/electric vehicle. The circuit apparatus may comprise a power connection, by means of which the circuit apparatus is electrically connected to a voltage source or a positive power connection of the voltage source. The circuit apparatus may further comprise a ground connection, by means of which the circuit apparatus is electrically connected to electrical ground. The circuit apparatus may further comprise a positive connection and a negative connection. The circuit apparatus is electrically connected to a line end of the interlock loop via the positive connection and to a further line end of the interlock loop via the negative connection. The circuit apparatus may further comprise a measuring arrangement, which is configured to measure a first voltage potential (as a first potential measurement value) at the negative connection if a first current (including a current having a current intensity of 0 amperes) flows from the power connection via the negative connection to the ground connection.

The measuring arrangement may measure a second voltage potential (as a second potential measurement value) at the negative connection if a second current (including a current having a current intensity of 0 amperes), which is different from the first current (for example by a different current intensity or opposite current flow direction), flows from the power connection via the negative connection to the ground connection. The measuring arrangement has for this purpose a signal input, by means of which the measuring arrangement is electrically connected to the negative connection and measures the voltage potential at the negative connection. The circuit apparatus may comprise a detector arrangement electrically connected on the signal input side to the signal output of the measuring arrangement.

The detector arrangement comprises a comparison unit, which is configured to compare the first potential measurement value forwarded by the measuring arrangement with a first and a second potential reference value and to compare the second potential measurement value forwarded by the measuring arrangement with a third and a fourth potential reference value. The detector arrangement is further configured to detect, based on the comparison results of the comparison unit, whether the negative connection is electrically short-circuited with the positive connection, the power connection or the ground connection, or with none of the three connections (the positive connection, the power connection, and/or the ground connection).

The circuit apparatus may be disposed on a single circuit carrier, wherein the detector arrangement may comprise a microprocessor, for example. Alternatively, the circuit apparatus can be distributed in a decentralized manner on a plurality of circuit carriers.

There are various possible fault sources that put the interlock loop into a fault state. The following three fault states are possible faulty states that are particularly relevant for the functionality of the interlock loop or that are particularly dangerous for humans and animals and therefore need to be unambiguously separated from the other faulty states of the interlock loop and be treated separately. These states are:

an electrical interruption in the interlock loop;
an electrical short circuit of the interlock loop with the voltage source;
an electrical short circuit of the interlock loop with the electrical ground.

The teachings of the present disclosure may be employed to reliably detect these three fault states unambiguously in relation to one another and in relation to the other faulty states. The circuit apparatus may include a measuring arrangement used to measure a voltage potential at a line end of the interlock loop, said line end being electrically connected to a negative connection of the interlock loop. The voltage potential at said line end constitutes a voltage that is dropped between said line end of the interlock loop and the electrical ground. In this case, said voltage changes depending on the state of the interlock loop, in particular the three aforementioned relevant fault states of the interlock loop.

The other faulty states in the interlock loop may also lead to changes in the abovementioned voltage. In addition, it has been found that faults that lead to changes in said voltage can also arise in the circuit apparatus itself. Nevertheless, to unambiguously and reliably separate the three relevant fault states from one another and from the other faulty states in the interlock loop and the faults in the circuit apparatus, the apparatuses described herein carry out at least two measurements of said voltage at different electrical currents, wherein said currents differ from one another in terms of their current intensities or current flow directions. Taking multiple measurements provides at least two potential measurement values of said voltage or of the corresponding voltage potential, which a detector arrangement connected downstream may then compare with at least two potential reference values determined in advance. The comparison results may then be logically combined with one another by the detector arrangement and compared with pre-detected logic (reference) combinations, which in each case are assigned to the respective previously described three fault states, a fault-free state of the interlock loop and the other fault states that are not relevant. Based on the comparison result of the logic combinations, the present state of the interlock loop, in particular with regard to the three relevant fault states, can then be unambiguously and reliably detected.

The teachings of the present disclosure may be employed to monitor the high-voltage components, e.g., a traction battery, power electronics, an electric machine, and/or a supercapacitor (super-cap) of a vehicle and therefore may reliably protect humans and animals from the dangers of the high-voltage components.

The circuit apparatus may comprise a controllable current source, e.g., a current source that can be switched on and off in a controlled manner, connected between the negative connection and the ground connection and configured to provide the two aforementioned currents (including the currents with current intensities of 0 amperes). In this case, the current source may comprise a constant current source or as a scalable or modulatable current source. The current source may comprise a current mirror circuit configured to provide load-independent currents that remain constant independently of the voltage fluctuations in the operating voltage of the voltage source.

The circuit apparatus may comprise a current limiting circuit electrically connected between the power connection and the positive connection and between the power connection and the negative connection or the measuring arrangement. The current limiting circuit may limit the currents flowing through the interlock loop or the circuit apparatus and therefore to protect the circuit apparatus from an overvoltage or an overcurrent.

The circuit apparatus may comprise a bridging resistor electrically connected between the power connection and the negative connection or between the positive and the negative connection. The bridging resistor may bridge the interlock loop if the interlock loop and therefore the electrical connection between the positive and the negative connection is interrupted.

The measuring arrangement may comprise a protection circuit unit connected between the signal output of the measuring arrangement and the signal input of the detector arrangement and configured to protect the detector arrangement from an overvoltage and/or undervoltage.

Some embodiments may include a contact protection circuit for monitoring at least one high-voltage component, in particular of a vehicle, e.g., a hybrid electric or electric vehicle. The contact protection circuit may comprise an electrical interlock loop for monitoring the at least one high-voltage component and a circuit apparatus as described above for detecting the state of the interlock loop. In this case, the circuit apparatus is electrically connected to an electrical line end of the interlock loop via the positive connection and to a further electrical line end of the interlock loop via the negative connection.

In some embodiments, a vehicle, in particular a hybrid electric or electric vehicle, may comprise at least one high-voltage component, e.g., a traction battery, power electronics, an electric machine, and/or a supercapacitor, and at least one contact protection circuit as described above for monitoring the at least one high-voltage component.

Some embodiments may include a method for detecting a state of an electrical interlock loop as described above with a circuit apparatus as described above is provided. A first current (including a current having a current intensity of 0 amperes) is generated, which flows from the power connection of the circuit apparatus via the negative connection to the ground connection of the circuit apparatus. While the first current is flowing (or else no current is flowing), the voltage potential is measured as a first potential measurement value at the negative connection of the circuit apparatus. The first potential measurement value is then compared with a first potential reference value and a second potential reference value, wherein the second potential reference value is greater than the first potential reference value.

A second current (including a current having a current intensity of 0 amperes), which is different from the first current (for example by a different current intensity or opposite current flow direction), is generated, which likewise flows from the power connection of the circuit apparatus via the negative connection to the ground connection of the circuit apparatus. While the second current is flowing (or else no current is flowing), the voltage potential is measured as a second potential measurement value at the negative connection of the circuit apparatus.

The second potential measurement value is then compared with a third potential reference value and a fourth potential reference value, wherein the fourth potential reference value is greater than the third potential reference value. A fault-free, closed and therefore electrically conducting state of the interlock loop is ascertained if the first potential measurement value lies between the first and the second potential reference value and at the same time the second potential measurement value is greater than the fourth potential reference value. A faulty state of the interlock loop is assumed if the two abovementioned logic combinations between the two potential measurement values that are measured and the four potential reference values are not present at the same time.

An electrical interruption of the interlock loop may be ascertained if the first potential measurement value is smaller than the first potential reference value and at the same time the second potential measurement value is greater than the fourth potential reference value.

An electrical short circuit of the interlock loop or the negative connection of the circuit apparatus to the power connection of the circuit apparatus or to the positive power connection of the voltage source may be ascertained if the first potential measurement value is greater than the second potential reference value and at the same time the second potential measurement value is greater than the fourth potential reference value.

Analogously, an electrical short circuit of the interlock loop to the ground connection or to the electrical ground may be ascertained if the first potential measurement value is smaller than the first potential reference value and at the same time the second potential measurement value is smaller than the third potential reference value.

If none of the abovementioned logic combinations is present, then a further faulty state of the interlock loop or the circuit apparatus that cannot be unambiguously assigned is assumed.

FIG. 1 shows a contact protection circuit BS of an electric vehicle for high-voltage components HK of the electric vehicle, which comprise a traction battery, an electric machine, a supercapacitor, and/or power electronic circuits, for example. Operating voltages of these high-voltage components HK are much higher than 60 volts and are therefore extremely dangerous to humans and animals. To protect humans and animals from electric shocks, the high-voltage components HK may be electrically insulated from the surroundings by appropriate housings or other insulation measures. If one or more housings or one or more insulation measures of the high-voltage components HK are damaged or unintentionally opened or deactivated, e.g., by an external mechanical influence, this presents an imminent danger to the lives of humans and animals due to an electric shock.

To counteract this danger, the contact protection circuit BS comprises an interlock loop VS for monitoring the high-voltage components HK and the housings or other insulation measures thereof. The interlock loop VS may include an electrical line having a first line end LE1 and a second line end LE2 and comprises one or more controllable switches ST, which, depending on the states of the high-voltage components HK or the housings or other insulation measures thereof, can be opened or closed in a manner which will be described below. If all the switches ST are closed in a fault-free manner, the interlock loop VS is "closed", wherein the two line ends LE1, LE2 are electrically short-circuited with one another. However, if at least one switch ST is opened, then the interlock loop VS is interrupted and the two line ends LE1, LE2 are electrically "isolated" from one another.

The contact protection circuit BS may include a circuit apparatus SV used by the contact protection circuit BS to detect the state of the interlock loop VS and to ascertain potential dangers depending on the state of the interlock loop VS. The circuit apparatus SV has a positive connection PA and a negative connection NA. The circuit apparatus SV is electrically connected to the first line end LE1 of the interlock loop VS via the positive connection PA. The circuit apparatus SV is electrically connected to the second line end LE2 of the interlock loop VS via the negative connection NA. The circuit apparatus SV also has a first power connection SA1, via which the circuit apparatus SV is electrically connected to an external DC voltage source of a low-voltage on-board power system branch of the electric vehicle. The DC voltage source provides the circuit apparatus SV with an operating voltage Vss that is much lower than 60 volts.

Furthermore, the circuit apparatus SV has a second power connection SA2 and a third power connection SA3 and a ground connection ML, by means of which the circuit apparatus SV is electrically connected to electrical ground MS (the body of the electric vehicle).

The circuit apparatus SV may include a current limiting circuit SB electrically connected between the first power connection SA1 and the positive connection PA or between the first power connection SA1 and the negative connection NA. In this case, the current limiting circuit SB may include a star circuit with a star point ST and a first current path SD1 between the first power connection SA1 and the star point ST, a second current path SD2 between the positive connection PA and the star point ST, and a third current path SD3 between the star point ST and the negative connection NA.

In the first current path SD1, the current limiting circuit SB has a first resistor R11. In the second current path SD2, the current limiting circuit SB has a second and a third resistor R12, R13 connected in parallel with one another. In the third current path SD3, the current limiting circuit SB has a bridging resistor Rb. The bridging resistor Rb may also be arranged in the first current path SD1. Analogously, the current limiting circuit SB may comprise more or fewer resistors depending on embodiments.

Furthermore, the circuit apparatus SV comprises a current source SQ electrically connected between the negative connection NA and the ground connection ML or between the bridging resistor Rb and the ground connection ML. The current source SQ may be switchable in a controlled manner and generate currents of at least two different current values, such as for example 0 or 10 milliamperes. The current source SQ may include a current mirror circuit SP and a normally off n-channel MOSFET MT for providing constant currents, which can be generated independently of the load or independently of the operating voltage Vss applied at the first power connection SA1 and which are not influenced by the voltage fluctuations in the operating voltage Vss.

The current mirror circuit SP may include a reference current path RD and a load current path LD, wherein these two current paths RD, LD largely mirror-symmetrical to one another.

For example, the reference current path RD may include a bipolar transistor BT1 and a resistor R21 connected in series. Analogously, the load current path LD may include a further bipolar transistor BT2 and a further resistor R22 connected in series. In this case, the two bipolar transistors BT1, BT2 are of the same type and have the same dimensions. The two resistors R21, R22 are dimensioned in accordance with the current gain factor of the current mirror circuit SP. The base terminals of the two bipolar transistors BT1, BT2 are electrically connected to one another and to the collector terminal of the bipolar transistor BT1 on the reference current path side and by means of a further resistor R23 to the aforementioned second power connection SA2 of the circuit apparatus SV.

A constant DC voltage that is much lower than 60 volts may be applied to the current mirror circuit SP by means of the second power connection SA2. The load current path LD is electrically connected to the negative connection NA on the positive voltage side.

On the negative voltage side, the load current path LD and the reference current path RD are electrically connected to one other and to the ground connection ML and therefore to the electrical ground MS. The reference current path RD is electrically connected to the drain terminal of the aforementioned n-channel MOSFET MT on the positive voltage side and via the collector terminal. The n-channel MOSFET MT is therefore electrically connected via the drain terminal to the collector terminal of the bipolar transistor BT1 on the reference current path side and to the base terminals of the two bipolar transistors BT1, BT2. The MOSFET MT is electrically connected via the source terminal to the ground connection ML and therefore to the electrical ground MS.

The MOSFET MT is electrically connected to a signal connection SS via the gate terminal, a control signal being applied to the gate terminal by means of said signal connection to switch the MOSFET MT. The gate terminal is further electrically connected to the ground connection ML via a pull-down resistor R24.

The circuit apparatus SV may include a measuring arrangement MA likewise electrically connected between the negative connection NA and the ground connection ML. The measuring arrangement MA comprises a measurement path MD extending between the negative connection NA of the circuit apparatus SV and the ground connection ML. It may include a first resistor R31, a second resistor R32, and a capacitor C connected in series between the negative connection NA and the ground connection ML. In this case, the two resistors R31, R32 serve to stabilize the voltage potentials Φ, which are measured by the measuring arrangement MA in a manner which will be described below. The capacitor C compensates for the voltage fluctuations in the measurement path MD.

The measuring arrangement MA may include a protection circuit unit SE, which for its part comprises two diodes D1, D2 connected in series and in their respective forward directions pointing toward the third power connection SA3 between the aforementioned third power connection SA3 of the circuit apparatus SV and the ground connection ML.

The protection circuit unit SE may be electrically connected at a connection point AP1 of the measurement path MD via a center tap MB that electrically connects the two diodes D1, D2 to one another, said connection point electrically connecting the two resistors R31, R32 to one another. The protection circuit unit SE may limit the signal value of the measurement signal measured at the negative connection NA between a voltage potential applied at the third power connection SA3 and the ground potential and therefore to protect a detector arrangement EA, which will be described below, against overloading by overvoltages.

Furthermore, the circuit apparatus SV comprises the aforementioned detector arrangement EA connected in terms of signal to the measuring arrangement MA via a signal input SG with a connection point AP2 of the measurement path MD, wherein the connection point AP2 electrically connects the second resistor R32 and the capacitor C of the measuring arrangement MA to one another and at the same time forms a signal output of the measuring arrangement MA. The detector arrangement EA comprises a comparator KP (e.g., a comparison unit), which compares the measurement values forwarded by the measuring arrangement MA directly with predefined reference values. As an alternative or in addition, the detector arrangement EA comprises an analog-to-digital converter that is configured to convert the analog measurement values, which are measured by the measuring arrangement MA and transmitted to the detector arrangement EA, into digital measurement values that are then compared by the detector arrangement EA with reference values that have been determined in advance and stored as digital variables.

Figure 2:
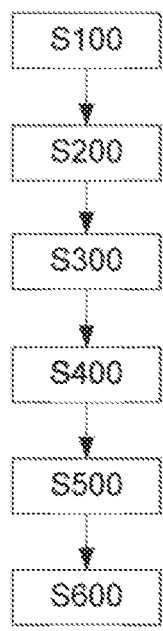
FIG. 2 shows a flow diagram of a method for detecting a state of an electrical interlock loop with the circuit apparatus according to teachings of the present disclosure.

The functioning of the contact protection circuit BS described above will be described below with reference to FIG. 2 and in connection with various states in the high-voltage components HK that are to be monitored and in the interlock loop VS. The contact protection circuit BS monitors the states of the housings and the other insulation measures of the high-voltage components HK by means of the interlock loop VS, in particular by means of the switch or switches ST in the interlock loop VS.

The following states may be detected and ascertained here:

State 1:

As long as the housings of the high-voltage components HK are closed in a fault-free manner and the insulation measures of the high-voltage components HK function in a fault-free manner, and therefore the high-voltage components HK are securely electrically insulated from the surroundings, the switches ST in the interlock loop VS may be kept closed in a manner known to those skilled in the art. In these fault-free states, the first and the second line end LE1, LE2 of the interlock loop VS are electrically short-circuited with one another by means of the closed switches ST.

State 2:

As soon as one or more housings or one or more insulation measures of the high-voltage components HK are damaged or unintentionally opened or deactivated, for example by a mechanical influence, one or more switches ST are opened in a manner known to those skilled in the art. As a result, the interlock loop VS is interrupted and the two line ends LE1, LE2 of the interlock loop VS are electrically isolated from one another.

State 3:

The interlock loop VS, which itself is closed (not electrically isolated), may be electrically short-circuited at the first power connection SA1 and therefore at the external voltage source by a faulty connection or other faults.

State 4:

Analogously, the interlock loop VS, which itself is closed (and is therefore not electrically isolated), may be electrically short-circuited at the ground connection ML and therefore at the electrical ground MS by a faulty connection or other faults.

Further States:

There are also further states of the interlock loop VS that cannot be unambiguously assigned to a specific fault response of the interlock loop VS. However, these states unambiguously differ from the aforementioned states 1 to 4.

The aforementioned states of the interlock loop VS are ascertained by the circuit apparatus SV in the manner described below:

To check which of the abovementioned states is present, in a first measuring process according to a method step S100, a first control signal with a signal level of "logic zero" (generally with a signal voltage of 0 volts) is applied to the gate terminal of the MOSFET MT of the current source SQ by means of the signal connection SS. As a result, the MOSFET MT is opened and the bipolar transistor BT1 on the reference current path side is closed. The current source SQ therefore becomes active and generates a constant direct current I1, which flows through the load current path LD and therefore from the first power connection SA1 via the load current path LD to the ground connection ML.

If the aforementioned state 1 is present (the housings and other insulation measures of the high-voltage component HK are fault-free) and therefore all switches ST in the interlock loop VS are closed, the direct current I1 generated by the current source SQ flows in a manner divided by the current limiting circuit SB and partly through the resistors R12, R13 of the current limiting circuit SB to the interlock loop VS and partly directly to the bridging resistor Rb.

The operating voltage Vss applied at the first power connection SA1 is then dropped across the resistors R11, R12, R13 and the bridging resistor Rb as well as the resistor R22. It is therefore possible at the negative connection NA to measure a voltage potential Φ (or the voltage between the negative connection NA and the ground connection ML) whose value is smaller than the value of the operating voltage Vss but is close to this value (on account of the triple parallel connection of the three resistors R12, R13 and Rb as a result of the closed interlock loop VS).

If the aforementioned state 2 is present (one of the housings is opened or one of the other insulation measures is faulty) and therefore the corresponding switches ST are opened and consequently the interlock loop VS is also interrupted, the direct current I1 generated by the current source SQ flows from the first power connection SA1 exclusively via the bridging resistor Rb to the ground connection ML. Due to the interruption of the interlock loop VS, no current flows through the parallel current path SD2 via the two resistors R12, R13. As a result, the total electrical resistance between the first power connection SA1 and the negative connection NA will be somewhat larger than the total resistance of the triple parallel connection in state 1. Consequently, it is possible to measure a voltage potential Φ at the negative connection NA whose value is below the value of the operating voltage Vss and also below the value of the voltage potential Φ measured in state 1.

If the abovementioned state 3 is present (the interlock loop VS is electrically short-circuited at the power connection SA1) and therefore the negative connection NA is electrically short-circuited at the power connection SA1, a voltage potential Φ whose value is close to the value of the operating voltage Vss is measured at the negative connection NA.

If the abovementioned state 4 is present (the interlock loop VS is electrically short-circuited at the ground connection ML) and therefore the negative connection NA is electrically short-circuited at the ground connection ML, a voltage potential Φ whose value is close to the value of the ground potential is measured at the negative connection NA.

According to a further method step S200, the voltage potential Φ at the negative connection NA is measured by the measuring arrangement MA and forwarded to the detector arrangement EA as a first potential measurement value Φ1.

According to a further method step S300, the detector arrangement EA then compares the first potential measurement value Φ1 with a first and a second predefined potential reference value Ur1, Ur2, where it holds true that: Ur1<Ur2.

Furthermore, in a second measuring process according to a further method step S400, a second control signal with a signal level of "logic one" (generally with a voltage of 5 volts) is applied to the gate terminal of the MOSFET MT by means of the signal connection SS. As a result, the MOSFET MT is closed and the two bipolar transistors BT1, BT2 are opened. The current source SQ therefore becomes inactive. Consequently, no current or a current I2 with a current intensity of 0 amperes flows from the first power connection SA1 via the load current path LD to the ground connection ML.

If one of the states 1, 2 or 3 is present, a voltage potential Φ whose value (as a second potential measurement value Φ2) is close to the value of the operating voltage Vss is measured at the negative connection NA.

If the abovementioned state 4 is present, a voltage potential whose value is close to the value of the ground potential is measured at the negative connection NA.

According to a further method step S500, the voltage potential Φ at the negative connection NA is measured by the measuring arrangement MA and forwarded to the detector arrangement EA as a second potential measurement value Φ2.

According to a further method step S600, the detector arrangement EA then compares the second potential measurement value Φ2 with a third and a fourth predefined potential reference value Ur3, Ur4, where it holds true that: Ur3<Ur4.

If the first potential measurement value Φ1 is between the first and the second potential reference value Ur1 and Ur2 and at the same time the second potential measurement value Φ2 is greater than the fourth potential reference value Ur4 (i.e. if a following logic combination is satisfied: Ur1<Φ1<Ur2 & Ur4<Φ2), it is ascertained that state 1 is present and the interlock loop VS is closed in a fault-free manner.

If the first potential measurement value Φ1 is smaller than the first potential reference value Ur1 and at the same time the second potential measurement value Φ2 is greater than the fourth potential reference value Ur4 (i.e. if a following logic combination is satisfied: Φ1<Ur1 & Ur4<Φ2), it is ascertained that state 2 is present and one of the switches ST is opened and therefore the interlock loop VS is electrically interrupted. If the first potential measurement value Φ1 is greater than the second potential reference value Ur2 and at the same time the second potential measurement value Φ2 is greater than the fourth potential reference value Ur4 (i.e. a following logic combination is satisfied: Ur2<Φ1 & Ur4<Φ2), it is ascertained that state 3 is present and the interlock loop VS is electrically short-circuited to the first power connection SA1 or the voltage source.

If the first potential measurement value Φ1 is smaller than the first potential reference value Ur1 and at the same time the second potential measurement value Φ2 is smaller than the third potential reference value Ur3 (i.e. if a following logic combination is satisfied: Φ1<Ur1 & Φ2<Ur3), it is ascertained that state 4 is present and the interlock loop VS is electrically short-circuited to the ground connection ML or the electrical ground MS.

If a logic combination different from the combinations described above is present between the two potential measurement values Φ1, Φ2 and the four potential reference values Ur1, Ur2, Ur3 and Ur4, it is ascertained that one of the aforementioned further states that cannot be assigned unambiguously is present.

If faulty state 2 is ascertained, the detector arrangement EA emits a signal to a central control device (not illustrated in the figure) of the electric vehicle and causes said control device to deactivate the high-voltage components HK, for example by discharging or by electrically isolating them from the on-board power system of the electric vehicle.

If faulty state 3 or 4 is ascertained, the detector arrangement EA emits for example a further signal to a vehicle signal display device (not illustrated in the figure) and makes the driver of the electric vehicle aware of the faulty state, such that he or she takes the electric vehicle to a vehicle workshop in order to repair the contact protection circuit BS.

What is claimed is:

1. A circuit apparatus for detecting a state of an electrical interlock loop monitoring at least one high-voltage component, the apparatus comprising:
   a power connection to a voltage source;
   a ground connection to an electrical ground;
   a positive connection to a line end of the electrical interlock loop;
   a negative connection to a second line end of the interlock loop;
   a measuring arrangement for a voltage potential at the negative connection when two mutually different currents flow from the power connection via the negative connection to the ground connection; and
   a detector arrangement, including a comparison unit for comparing the two potential measurement of the voltage potential measured at the two respective currents with two predefined potential reference values and configured to ascertain, based on the comparison results of the comparison unit, whether the negative connection is electrically short-circuited with the positive connection, the power connection, or the ground connection, or with none of these connections.

2. The circuit apparatus as claimed in claim 1, further comprising a controllable current source providing the two currents, said current source connected between the negative connection and the ground connection.

3. The circuit apparatus as claimed in claim 2, wherein the current source comprises a constant current source or a scalable or modulatable current source.

4. The circuit apparatus as claimed in claim 2, wherein the current source comprises a current mirror circuit.

5. A contact protection circuit for monitoring at least one high-voltage component, the circuit comprising:
- an electrical interlock loop for monitoring the at least one high-voltage component;
- a power connection to a voltage source;
- a ground connection to an electrical ground;
- a positive connection to a line end of the electrical interlock loop;
- a negative connection to a second line end of the interlock loop;
- a measuring arrangement for a voltage potential at the negative connection when two mutually different currents flow from the power connection via the negative connection to the ground connection; and
- a detector arrangement, including a comparison unit for comparing the two potential measurement of the voltage potential measured at the two respective currents with two predefined potential reference values and configured to ascertain, based on the comparison results of the comparison unit, whether the negative connection is electrically short-circuited with the positive connection, the power connection, or the ground connection, or with none of these connections;
- wherein the circuit is electrically connected to a line end of the interlock loop via the positive connection and to a further line end of the interlock loop via the negative connection.

6. A vehicle comprising:
- at least one high-voltage component;
- an electrical interlock loop for monitoring the at least one high-voltage component;
- a power connection to a voltage source;
- a ground connection to an electrical ground;
- a positive connection to a line end of the electrical interlock loop;
- a negative connection to a second line end of the interlock loop;
- a measuring arrangement for a voltage potential at the negative connection when two mutually different currents flow from the power connection via the negative connection to the ground connection; and
- a detector arrangement, including a comparison unit for comparing the two potential measurement of the voltage potential measured at the two respective currents with two predefined potential reference values and configured to ascertain, based on the comparison results of the comparison unit, whether the negative connection is electrically short-circuited with the positive connection, the power connection, or the ground connection, or with none of these connections;
- wherein the circuit is electrically connected to a line end of the interlock loop via the positive connection and to a further line end of the interlock loop via the negative connection.

7. A method for detecting a state of an electrical interlock loop for monitoring at least one high-voltage component, the method comprising:
- generating a first current flowing from a power connection via a negative connection to a ground connection;
- measuring a first voltage potential at the negative connection while the first current is flowing;
- comparing a first measured potential measurement value with a first and a second potential reference value, wherein the first potential reference value is less than the second potential reference value;
- generating a second current flowing from the power connection via the negative connection to the ground connection;
- measuring a second voltage potential at the negative connection while the second current is flowing;
- comparing the measured second potential measurement value with a third and a fourth potential reference value, wherein the third potential reference value is less than the fourth potential reference value;
- ascertaining a fault-free state of the interlock loop if the first potential measurement value lies between the first and the second potential reference value and the second potential measurement value is greater than the fourth potential reference value.

8. The method as claimed in claim 7, further comprising ascertaining an electrical interruption of the interlock loop if the first potential measurement value is smaller than the first potential reference value and the second potential measurement value is greater than the fourth potential reference value.

9. The method as claimed in claim 7, further comprising ascertaining an electrical short circuit of the interlock loop to the power connection if the first potential measurement value is greater than the second potential reference value and the second potential measurement value is greater than the fourth potential reference value.

10. The method as claimed in claim 7, further comprising ascertaining an electrical short circuit of the interlock loop to the ground connection if the first potential measurement value is smaller than the first potential reference value and the second potential measurement value is smaller than the third potential reference value.

* * * * *